(12) United States Patent
Shimooka et al.

(10) Patent No.: US 8,921,997 B2
(45) Date of Patent: Dec. 30, 2014

(54) ELECTRICAL COMPONENT AND METHOD OF MANUFACTURING THE SAME

(75) Inventors: Yoshiaki Shimooka, Sagamihara (JP); Yoshiaki Sugizaki, Fujisawa (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 481 days.

(21) Appl. No.: 13/215,457

(22) Filed: Aug. 23, 2011

(65) Prior Publication Data

US 2012/0049390 A1    Mar. 1, 2012

(30) Foreign Application Priority Data

Aug. 25, 2010    (JP) .................................. 2010-188664

(51) Int. Cl.
| H01L 29/84 | (2006.01) |
| H01L 23/12 | (2006.01) |
| B81C 1/00 | (2006.01) |
| H01L 23/31 | (2006.01) |

(52) U.S. Cl.
CPC ..... *B81C 1/00333* (2013.01); *B81C 2203/0136* (2013.01); *H01L 2924/0002* (2013.01); *B81C 2203/0145* (2013.01); *H01L 23/3171* (2013.01)
USPC ........................................................ 257/704

(58) Field of Classification Search
USPC ................................................. 257/254, 704
See application file for complete search history.

(56) References Cited

U.S. PATENT DOCUMENTS

| 6,156,623 | A | * | 12/2000 | Hendrix et al. ............... 438/457 |
| 7,008,812 | B1 |  | 3/2006 | Carley |
| 7,381,583 | B1 |  | 6/2008 | Ebel et al. |
| 7,390,687 | B2 | * | 6/2008 | Boettiger et al. .............. 438/64 |
| 7,417,307 | B2 | * | 8/2008 | Haluzak et al. ............... 257/682 |
| 7,648,859 | B2 | * | 1/2010 | Robert .......................... 438/127 |
| 7,919,362 | B2 | * | 4/2011 | Bolis ............................ 438/127 |
| 7,923,790 | B1 | * | 4/2011 | Quevy et al. .................. 257/415 |
| 8,043,880 | B2 | * | 10/2011 | Haluzak et al. ................ 438/50 |
| 2001/0004085 | A1 | * | 6/2001 | Gueissaz .................... 228/124.6 |
| 2006/0076648 | A1 | * | 4/2006 | Gally et al. ................... 257/619 |
| 2009/0101383 | A1 |  | 4/2009 | Miyagi et al. |
| 2009/0188709 | A1 |  | 7/2009 | Kojima et al. |
| 2010/0193886 | A1 | * | 8/2010 | Nakatani et al. .............. 257/416 |
| 2010/0203664 | A1 | * | 8/2010 | Tsai et al. ....................... 438/52 |

* cited by examiner

*Primary Examiner* — James Mitchell
(74) *Attorney, Agent, or Firm* — White & Case LLP

(57) ABSTRACT

According to one embodiment, an electrical component comprises a substrate, an element, a first layer, and a second layer. The element is formed on the substrate. The first layer forms a cavity accommodating the element on the substrate and includes through holes. The second layer is formed on the first layer and seals the through holes. The first layer includes the first film formed on the lower side and the second film which is formed on the first film and has a lower coefficient of thermal expansion than the first film.

17 Claims, 5 Drawing Sheets

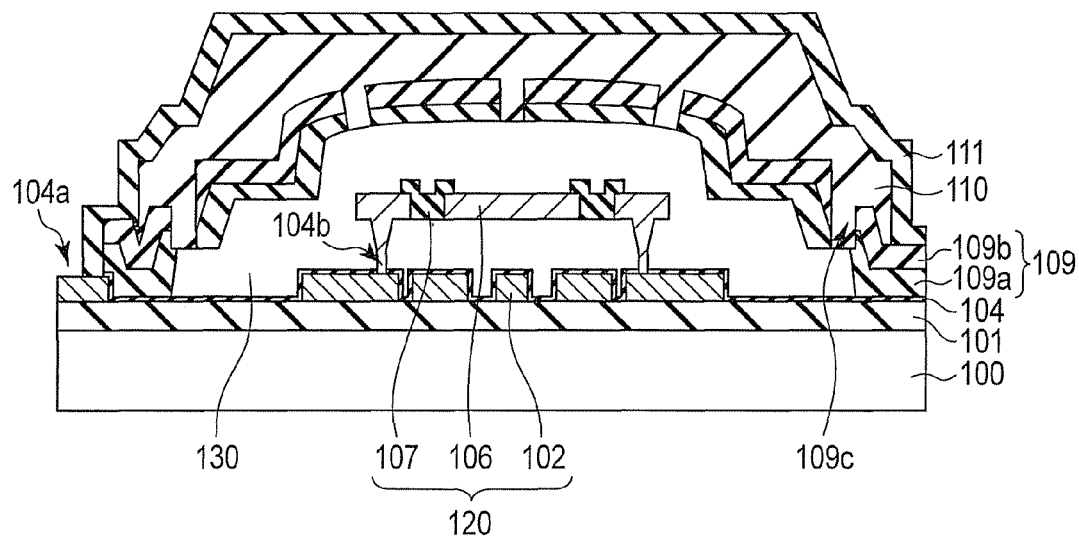
F I G. 1

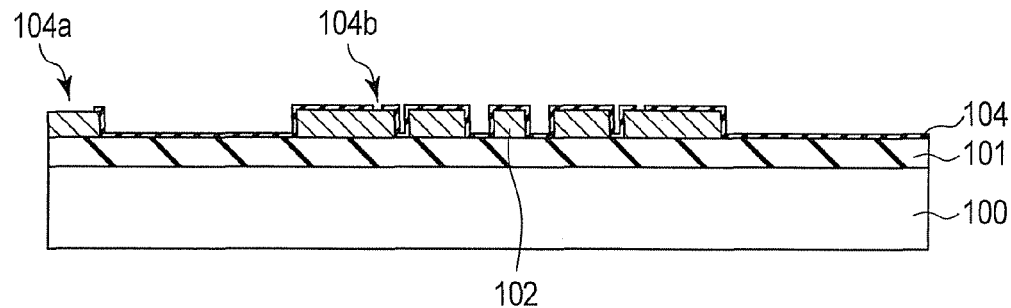
F I G. 2A
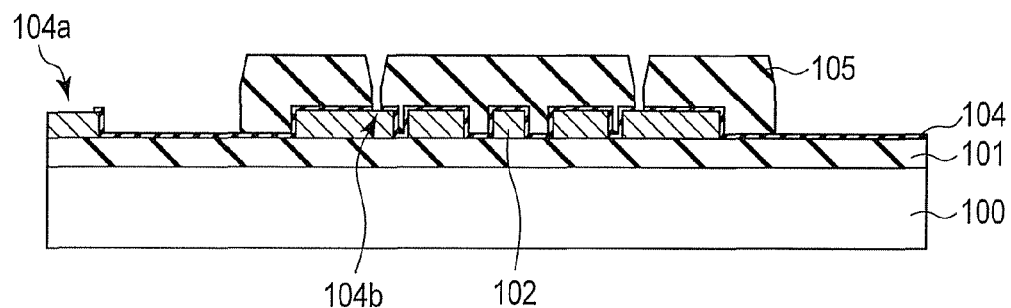
F I G. 2B
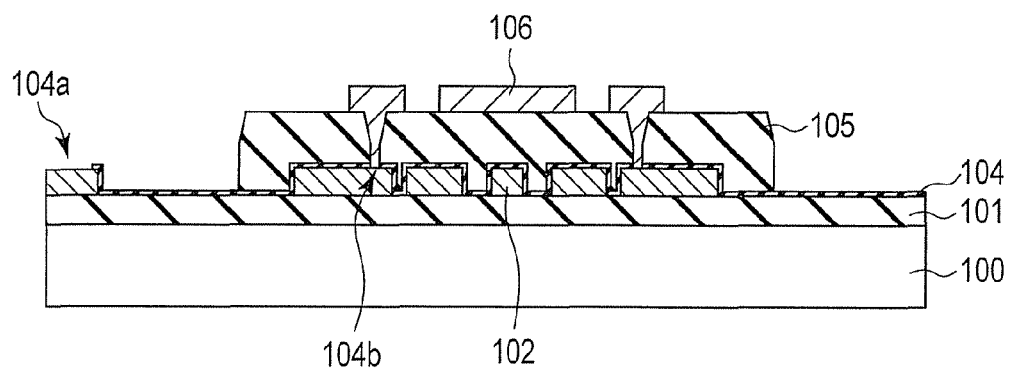
F I G. 2C

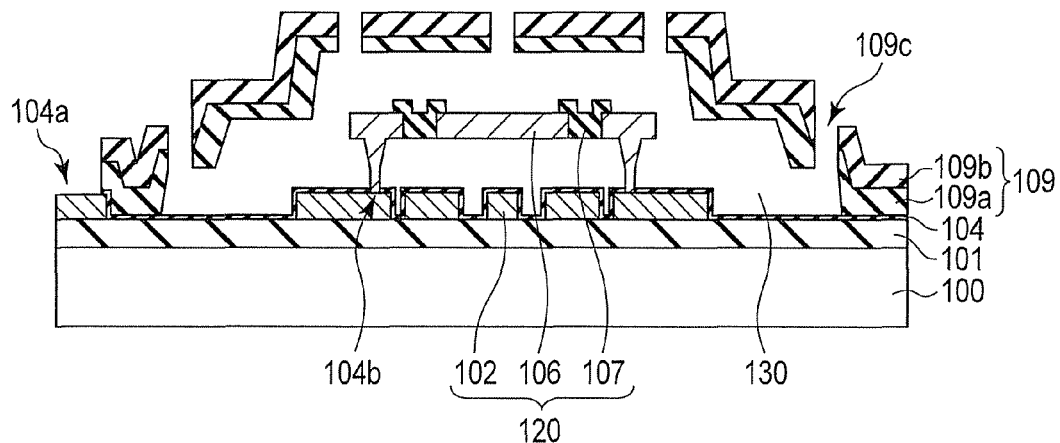
F I G. 4A
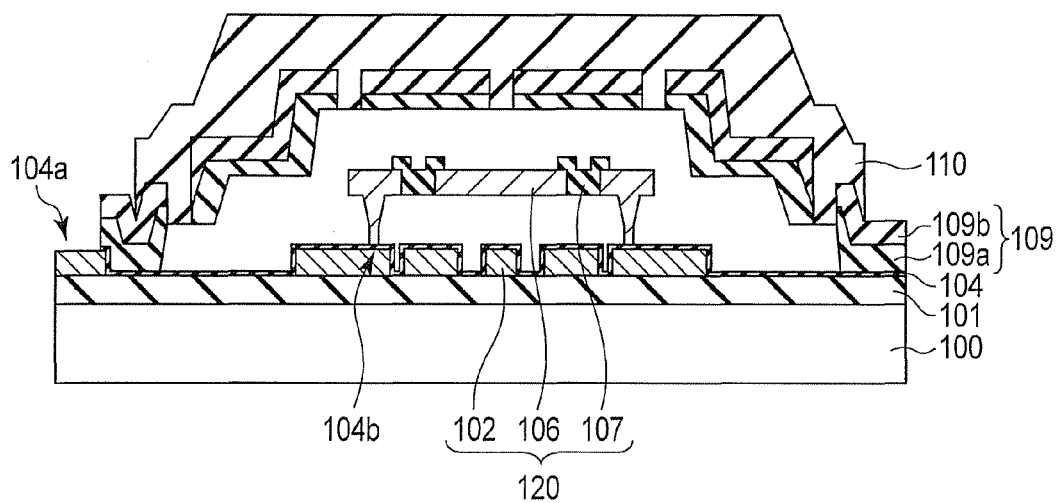
F I G. 4B

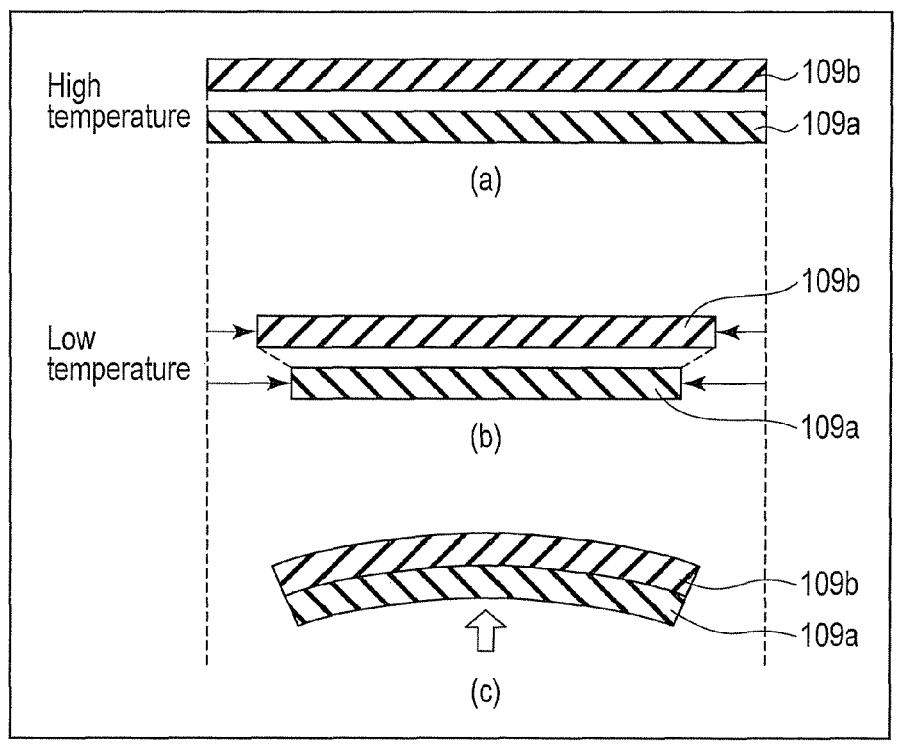
F I G. 5
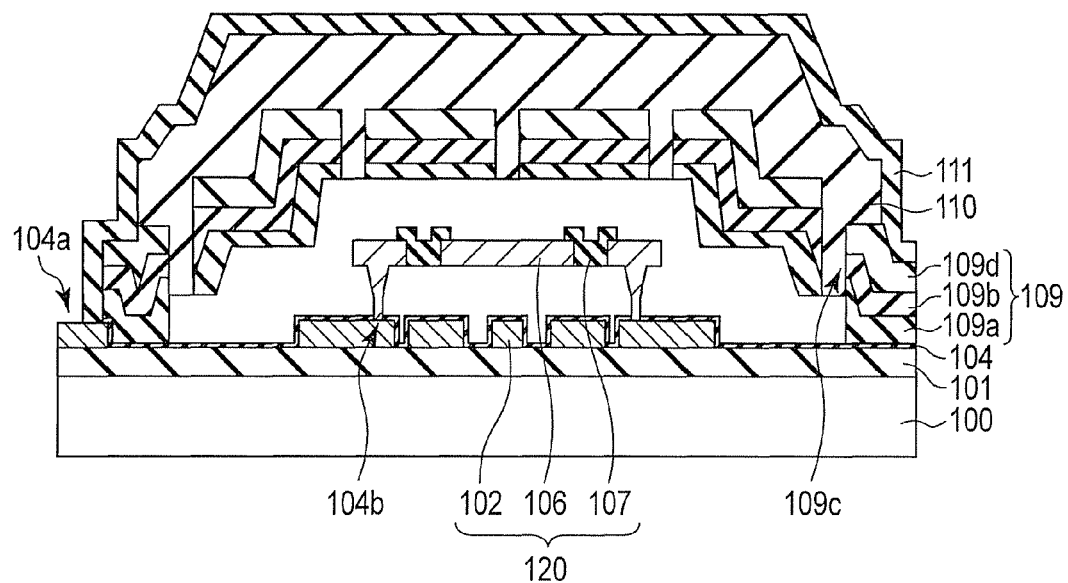
F I G. 6

ELECTRICAL COMPONENT AND METHOD OF MANUFACTURING THE SAME

CROSS-REFERENCE TO RELATED APPLICATIONS

This application is based upon and claims the benefit of priority from prior Japanese Patent Application No. 2010-188664, filed Aug. 25, 2010, the entire contents of which are incorporated herein by reference.

FIELD

Embodiments described herein relate generally to an electrical component and a method of manufacturing the same.

BACKGROUND

As a feature of a MEMS (Micro Electro Mechanical Systems) device, it has a mechanical movable portion unlike general semiconductor devices. When implementing a MEMS device, a cavity is required as an operation space for the mechanical movable portion. That is, an implementing technique and a package forming a hollow structure are used for a MEMS device.

BRIEF DESCRIPTION OF THE DRAWINGS

FIG. 1 is a sectional view showing the structure of an electrical component according to the first embodiment;

FIGS. 2A to 4B are sectional views showing a process of manufacturing an electrical component according to the first embodiment;

FIG. 5 is a view for explaining the principle of a thin-film dome according to the first embodiment; and FIG. 6 is a sectional view showing the structure of an electrical component according to the second embodiment.

DETAILED DESCRIPTION

Figure 3A:
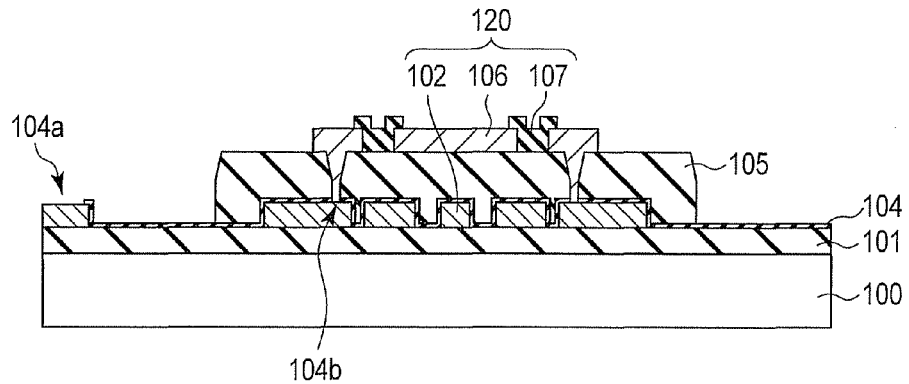

In general, according to one embodiment, an electrical component comprises a substrate, an element, a first layer, and a second layer. The element is formed on the substrate. The first layer forms a cavity accommodating the element on the substrate and includes through holes. The second layer is formed on the first layer and seals the through holes. The first layer includes the first film formed on the lower side and the second film which is formed on the first film and has a lower coefficient of thermal expansion than the first film.

This embodiment will be described below with reference to the views of the accompanying drawing. The same reference numerals denote the same parts throughout the views of the accompanying drawing.

First Embodiment

An electrical component according to the first embodiment will be described with reference to FIGS. 1 to 5. The first embodiment exemplifies a case in which the first layer having an opening is formed as a thin-film dome by two films with different coefficients of thermal expansion (CTEs).

[Structure]

FIG. 1 is a sectional view of an electrical component according to the first embodiment.

As shown in FIG. 1, the electrical component according to this embodiment includes a substrate 100 having a functional element 120, a first layer 109, a second layer 110, and a third layer 111.

The substrate 100 is, for example, a silicon substrate. An insulating film 101 made of, for example, an SiO ($SiO_2$) film (silicon oxide film) is formed on the substrate 100. The functional element 120 is formed on the insulating film 101. The functional element 120 is, for example, an electrostatically-driven MEMS variable capacitor.

The functional element 120 includes a first metal interconnection 102, a second metal interconnection 106 facing the first metal interconnection 102 with a gap, and an insulator connecting portion 107 which connects the second metal interconnections 106 to each other. The first metal interconnection 102 and the second metal interconnection 106 are made of, for example, aluminum. The insulator connecting portion 107 is made of, for example, an SiN film. In the functional element 120, when a voltage is applied between the first metal interconnection 102 and the second metal interconnection 106, the capacitance changes as the distance between the first metal interconnection 102 and the second metal interconnection 106 changes due to an electrostatic attractive force.

A passivation film 104 is formed on the first metal interconnection 102 by, for example, an SiO ($SiO_2$) film or SiN film (silicon nitride film). The passivation film 104 is open on a pad portion 104a and a connection hole portion 104b. The pad portion 104a is formed outside the third layer 111 (to be described later) and is electrically connected to an external electrode (not shown). That is, the functional element 120 is electrically connected to the external electrode via the pad portion 104a. In addition, at the connection hole portion 104b, the first metal interconnection 102 is electrically connected to the second metal interconnection 106.

The functional element 120 is formed in a cavity 130. The cavity 130 is an area for securing an operation space for the functional element 120. A dry atmosphere or vacuum atmosphere is maintained in the cavity 130. This prevents deterioration in the first and second metal interconnections 102 and 106 which are made of aluminum due to, for example, a harmful gas or moisture, thereby preventing deterioration in the characteristics of the MEMS variable capacitor.

The first layer 109 forms the cavity 130 accommodating the functional element 120 and has a plurality of through holes (openings) 109c. The first layer 109 functions as a thin-film dome for protecting the functional element 120 against the outside.

The plurality of through holes 109c of the first layer 109 serve to form the cavity 130 by etching sacrificial layers (to be described later) after the formation of the functional element 120. That is, the sacrificial layers are etched through the through holes 109c.

The details of the first layer 109 will be described later.

The second layer 110 is formed on the first layer 109 to seal the plurality of through holes 109c. The second layer 110 has a function of adjusting the atmosphere in the cavity 130 while sealing the cavity 130.

The second layer 110 is preferably made of a coating film made of an organic material such as polyimide. This makes it possible to easily and reliably seal the through holes 109c even if the size (diameter or opening area) of the through holes 109c is large. Therefore, the size and placement of the through holes 109c are not specifically limited. For this reason, placing the plurality of through holes 109c with a large size can reliably etch the sacrificial layers (to be described later) in a short period of time.

Note that the second layer 110 is not limited to the coating film made of an organic material, and may be made of an insulating film such as an SiO ($SiO_2$) film or SiN film.

The third layer 111 is formed on the second layer 110. The third layer 111 functions as a moisture-proof film which prevents moisture in the atmosphere from permeating through the second layer 110 and entering the cavity 130. The third layer 111 is made of an insulating film such as an SiN film.

The first layer 109 in this embodiment will be described below. The first layer 109 in the embodiment is formed by a multilayer film including a first film 109a on the inner side (lower side) and a second film 109b on the outer side (upper side) which is formed on the first film 109a.

More specifically, the first film 109a has a higher coefficient of thermal expansion than the second film 109b. That is, in the first layer 109 having the through holes 109c, the coefficient of thermal expansion on the inner side is higher than that on the outer side.

In this case, the first film 109a is formed by, for example, an SiN film, and the second film 109b is formed by, for example, an SiO ($SiO_2$) film. The thin-film dome can have an outwardly expanding structure by forming the first layer 109 using two layers with different coefficients of thermal expansion in this manner, with the first film 109a on the inner side having a higher coefficient of thermal expansion than the second film 109b. That is, the cavity 130 can be formed large.

Note that the combination of the first film 109a and the second film 109b is not limited to an SiN film and an SiO ($SiO_2$) film. Another combination of the first film 109a and the second film 109b may be constituted by an SiN film with a high coefficient of thermal expansion and an SiN film with a low coefficient of thermal expansion or an SiO ($SiO_2$) film with a high coefficient of thermal expansion and an SiO ($SiO_2$) film with a low coefficient of thermal expansion. If the coefficient of thermal expansion of an SiO ($SiO_2$) film is higher than that of an SiN film, the first film 109a may be the SiO ($SiO_2$) film, and the second film 109b may be the SiN film. It is possible to properly control such coefficients of thermal expansion by the manufacturing method to be described later.

In addition, an SiN film having a high moisture-proofing property and suppresses permeation of moisture in the atmosphere. For this reason, it is preferable to form one of the first and second films 109a and 109b by using an SiN film.

Furthermore, the second layer 110 and the third layer 111 are preferably lower in coefficient of thermal expansion than the first layer 109. This makes it possible to make the thin-film dome have an outwardly expanding structure.

[Manufacturing Method]

FIGS. 2A to 4B are sectional views showing a process of manufacturing an electrical component according to the first embodiment. The following is a description of a process of forming a MEMS element in the electrical component to a process of forming a thin-film dome at a wafer level according to the first embodiment.

First of all, as shown in FIG. 2A, in the process of forming a MEMS element, the insulating film 101 is formed on the substrate 100 by using an SiO ($SiO_2$) film. On the insulating film 101, the first metal interconnection 102 made of aluminum is formed and patterned. The first metal interconnection 102 is formed to have a film thickness of, for example, several hundred nm to several μm. As a film formation method for the first metal interconnection 102, a sputtering method is used. In addition, as a patterning method, a conventional photolithography method and an RIE (Reactive Ion Etching) method may be used. Alternatively, photolithography and a wet etching method may be used. Note that the insulating film 101 may not be formed. In this case, the first metal interconnection 102 is directly formed on the substrate 100.

Subsequently, the passivation film 104 is formed on the entire surface of the first metal interconnection 102 by an SiO ($SiO_2$) film or SiN film. As a film formation method for the passivation film 104, for example, a CVD (Chemical Vapor Deposition) method is used. The passivation film 104 is formed to have a film thickness of, for example, several hundred nm to several μm. Thereafter, the passivation film 104 is patterned to form openings in the pad portion 104a and the connection hole portion 104b. That is, the first metal interconnection 102 is exposed at the pad portion 104a and the connection hole portion 104b. As a patterning method for the passivation film 104, for example, a photolithography method and an RIE method are used.

As shown in FIG. 2B, a first sacrificial layer 105 made of an organic material such as polyimide is applied to cover the first metal interconnection 102. The first sacrificial layer 105 is formed to have a film thickness of, for example, several hundred nm to several μm.

The first sacrificial layer 105 is then patterned into a desired shape. This exposes the first metal interconnection 102 at the pad portion 104a and the connection hole portion 104b. The first sacrificial layer 105 may be patterned by light exposure and development. Alternatively, the first sacrificial layer 105 may be patterned by using a resist pattern (not shown), formed on the first sacrificial layer 105 by a general lithography method, and an RIE method. Alternatively, an SiO film or the like (not shown) formed on the first sacrificial layer 105 may be patterned into a hard mask by a resist pattern, formed by a general lithography method, and an RIE method or wet etching method, and the first sacrificial layer 105 may be patterned by using the hard mask.

As shown in FIG. 2C, the second metal interconnection 106 made of, for example, aluminum is formed on the first sacrificial layer 105 and patterned. The second metal interconnection 106 is formed to have a film thickness of, for example, several hundred nm to several μm. With this structure, the second metal interconnection 106 is connected to the exposed first metal interconnection 102 of the connection hole portion 104b. As a film formation method for the second metal interconnection 106, a sputtering method is used. As a patterning method, a photolithography method and RIE method may be used. Alternatively, photolithography and a wet etching method may be used.

As shown in FIG. 3A, the insulator connecting portion 107 formed by, for example, an SiN film is formed between the second metal interconnections 106 and patterned. The insulator connecting portion 107 is formed to have a film thickness of, for example, several hundred nm to several μm. With this structure, the second metal interconnections 106 are connected to each other. As a film formation method and patterning method for the insulator connecting portion 107, conventional semiconductor techniques are used. With this process, the functional element 120 serving as a movable portion is completed.

Figure 3B:
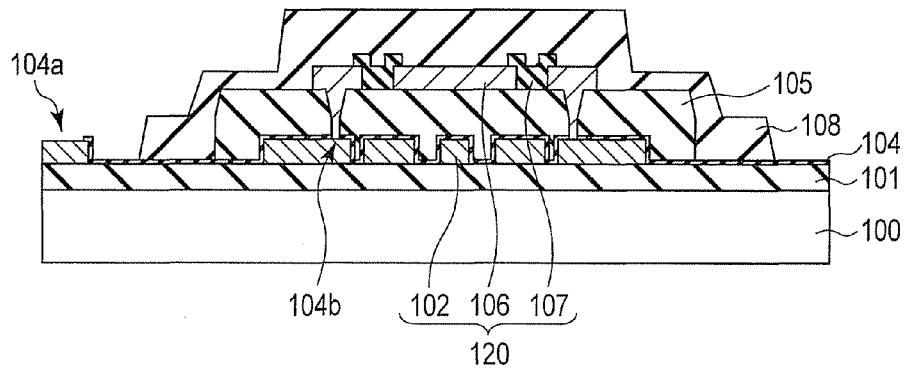

As shown in FIG. 3B, in the process of forming a thin-film dome at a wafer level, a second sacrificial layer 108 made of an organic material such as polyimide is applied to cover the MEMS element 120 and the first sacrificial layer 105. The second sacrificial layer 108 is formed to have a film thickness of, for example, several hundred nm to several μm.

Subsequently, the second sacrificial layer 108 is patterned into a desired shape. The second sacrificial layer 108 may be patterned by light exposure and development. Alternatively, the second sacrificial layer 108 may be patterned by using a resist pattern (not shown), formed on the second sacrificial layer 108 by a general lithography method, and an RIE method. Alternatively, an SiO film or the like (not shown)

formed on the second sacrificial layer 108 may be patterned into a hard mask by a resist pattern, formed by a general lithography method, and an RIE method or the wet etching method, and the second sacrificial layer 108 may be patterned by using the hard mask.

Figure 3C:
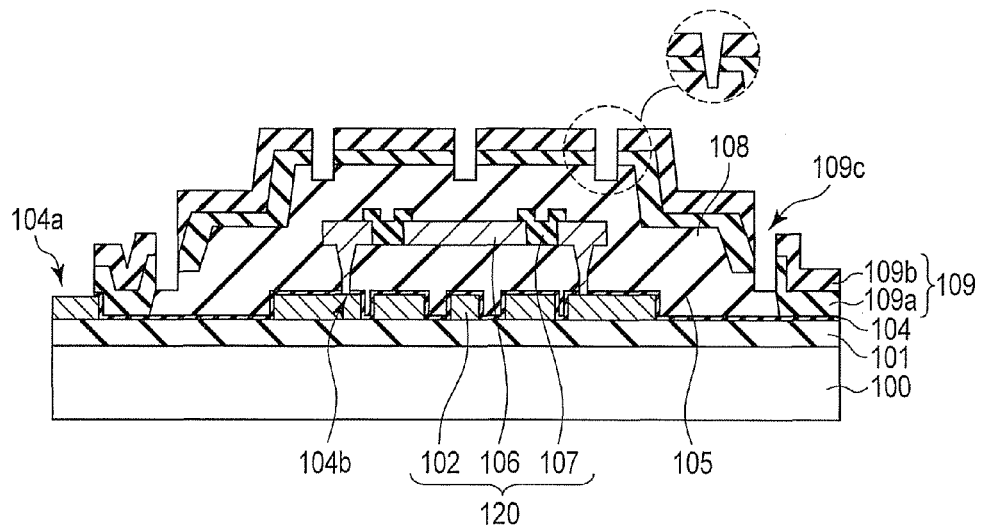

As shown in FIG. 3C, the first layer 109 having the plurality of through holes 109c is then formed to cover the second sacrificial layer 108.

More specifically, first of all, the first film 109a serving as the inside film of the thin-film dome is formed to cover the second sacrificial layer 108. The first film 109a is formed to have a film thickness of, for example, several hundred nm to several μm. The first film 109a is formed by, for example, an SiN film. As a film formation method for the first film 109a, a CVD method is used. Assume that, for example, the following conditions are set for this CVD method: the flow rate of $SiH_4$ gas is 500 sccm, the flow rate of $NH_3$ gas is 2 slm, the pressure is 5 Torr, and the temperature is 400° C. In addition, the RF output is 500 W to 2,000 W.

The second film 109b serving as the outside film of the thin-film dome is formed on the first film 109a. The second film 109b is formed to have a film thickness of, for example, several hundred nm to several μm. The second film 109b is formed by, for example, an SiO ($SiO_2$) film. The second film 109b is controlled to have a lower coefficient of thermal expansion than the first film 109a. As a film formation method for the second film 109b, a CVD method is used. Assume that, for example, the following conditions are set for this CVD method: the flow rate of $SiH_4$ gas is 200 sccm, the flow rate of $N_2O$ gas is 4 slm, the pressure is 3 Torr, and the temperature is 400° C. In addition, the RF output is 200 W to 1,000 W.

A resist (not shown) is applied onto the second film 109b. Thereafter, the plurality of through holes 109c for the removal of the first and second sacrificial layers 105 and 108 are formed in the inside film (first film 109a) and outside film (second film 109b) of the thin-film dome by using a resist pattern (not shown), formed by a general lithography method, and an RIE method or wet etching method.

In this case, it is preferable to shape each through hole 109c so as to gradually decrease its diameter from the outside to the inside by adjusting the selectivity between the resist pattern (not shown) and the first layer 109. In other words, the shape of each through hole 109c is preferably tapered such that the diameter gradually decreases from the upper side to the lower side. This is because this shape improves the sealing property of the through holes 109c after the first and second sacrificial layers 105 and 108 are removed.

In this manner, the first layer 109 having the plurality of through holes 109c is formed by the first film 109a on the inner side, which has a high coefficient of thermal expansion, and the second film 109b on the outer side, which has a low coefficient of thermal expansion.

Note that the combination of the first and second films 109a and 109b is not limited to an SiN film and an SiO ($SiO_2$) film. As the combination of the first and second films 109a and 109b, an SiN film with a high coefficient of thermal expansion and an SiN film with a low coefficient of thermal expansion may be used. In this case, assume that, for example, the following film formation conditions (CVD conditions) are set for an SiN film with a high coefficient of thermal expansion: the flow rate of $SiH_4$ gas is 500 sccm, the flow rate of $NH_3$ gas is 2 slm, the pressure is 5 Torr, the temperature is 400° C., and the RF output is 500 W. Assume also that, for example, the following film formation conditions (CVD conditions) are set for an SiN film with a low coefficient of thermal expansion: the flow rate of $SiH_4$ gas is 500 sccm, the flow rate of $NH_3$ gas is 2 slm, the pressure is 5 Torr, the temperature is 400° C., and the RF output is 2,000 W. That is, it is possible to control coefficients of thermal expansion by controlling the RF output of CVD conditions.

In addition, the combination of the first and second films 109a and 109b may be constituted by an SiO ($SiO_2$) film with a high coefficient of thermal expansion and an SiO ($SiO_2$) film with a low coefficient of thermal expansion. In this case, assume that, for example, the following film formation conditions (CVD conditions) are set for an SiO ($SiO_2$) film with a high coefficient of thermal expansion: the flow rate of $SiH_4$ gas is 200 sccm, the flow rate of $N_2O$ gas is 4 slm, the pressure is 3 Torr, the temperature is 400° C., and the RF output is 200 W. Assume also that, for example, the following film formation conditions (CVD conditions) are set for an SiO ($SiO_2$) film with a low coefficient of thermal expansion: the flow rate of $SiH_4$ gas is 200 sccm, the flow rate of $N_2O$ gas is 4 slm, the pressure is 3 Torr, the temperature is 400° C., and the RF output is 1,000 W.

As described above, controlling the film formation method can make an SiO ($SiO_2$) film have a higher coefficient of thermal expansion than an SiN film. In this case, the first film 109a may be an SiO ($SiO_2$) film, and the second film 109b may be an SiN film.

As shown in FIG. 4A, the resist pattern (not shown) and the first and second sacrificial layers 105 and 108 are removed by ashing using $O_2$ gas or the like. This releases the functional element 120 and forms the cavity 130 as an operation space for the functional element 120.

As shown in FIG. 4B, the second layer 110 is formed on the first layer 109. This structure seals the plurality of through holes 109c and the cavity 130. The second layer 110 is formed to have a film thickness of, for example, several hundred nm to several μm. The second layer 110 is formed by, for example, a coating film made of an organic material such as polyimide or an SiN film or SiO ($SiO_2$) film.

When the second layer 110 is to be made of an organic material such as polyimide, the coating is applied to the first layer 109 at room temperature, and then cured at 250° C. to 350° C. When the second layer 110 is to be formed by an SiN film or Sb ($SiO_2$) film, the film is formed by a CVD method at 250° C. to 350° C.

As described above, the formation temperature (250° C. to 350° C.) for the second layer 110 is equal to or lower than the formation temperature (250° C. to 400° C.) for the first layer 109 (first and second films 109a and 109b). Setting the temperature in the film formation process to be lower than that after the process in this manner can maintain the outwardly expanded state of the first layer 109. This principle will be described later. Forming the second layer 110 on the first layer 109 in this state makes the second layer 110 function as a sealing film and fixes the first layer 109 in the outwardly expanded state. That is, the first layer 109 is fixed in a state in which the cavity 130 is expanded.

Note that the timing of expansion of the first layer 109 lies in the interval between the instant at which the sacrificial layers are removed and the instant the second layer 110 is formed. That is, it is necessary to lower the temperature before the formation of the second layer 110 after the removal of the sacrificial layers.

In addition, the first layer 109 can be formed by a CVD method at 250° C. to 350° C. In this case, the formation temperature for the second layer 110 needs to be lower than at least that for the first layer 109. In addition, the formation temperature for the first film 109a may differ from that for the second film 109b. In this case, the formation temperature for the second layer 110 may be set to be equal to or lower than one of those for the first and second films 109a and 109b (which is higher).

As shown in FIG. 1, the third layer 111 as a moisture-proof film is formed on the second layer 110. The third layer 111 is formed to have a film thickness of, for example, several hundred nm to several µm. The third layer 111 is formed by, for example, an SiN film. As a film formation method for the third layer 111, a CVD method is used.

Subsequently, the third layer 111 is patterned into a desired shape. The third layer 111 is patterned by using a resist pattern (not shown), formed by a general lithography method, and an RIE method or wet etching. In this manner, a WLP thin-film dome is completed.

FIG. 5 shows the principle of the first layer 109 in this embodiment.

As shown in (a) of FIG. 5, the first and second films 109a and 109b of the first layer 109 are formed at a high temperature (400° C.). Consider a case in which the first and second films 109a and 109b are formed to have the same width.

As shown in (b) of FIG. 5, a low temperature is set in the process of forming the second layer 110. At this time, as shown in (b) of FIG. 5, the first film 109a with a high coefficient of thermal expansion has a higher width change ratio than the second film 109b with a low coefficient of thermal expansion. More specifically, the first film 109a is smaller than the second film 109b.

As shown in (c) of FIG. 5, the first film 109a is actually in contact with the second film 109b. When two layers having different characteristics (coefficients of thermal expansion in this case) are in contact with each other, stresses are produced in these layers. In this case, when the first film 109a which becomes smaller in width is formed on the inner side (lower side) of the second film 109b, a stress acts toward the outer side (upper side). This stress forms the first layer 109 expanding to the upper side.

According to the first embodiment described above, the first layer 109, which has the plurality of through holes 109c and forms the cavity 130, is formed by the multilayer film including the first film 109a and the second film 109b. At this time, the first film 109a on the inner side has a higher coefficient of thermal expansion than the second film 109b on the outer side. Controlling coefficients of thermal expansion in this manner can make the first layer 109 have a structure expanding to the upper side and increase the cavity 130. This structure can prevent contact between the first layer 109 and the functional element 120 and the intrusion of the sealing film (second layer 110) into the cavity 130 due to capillarity, thereby improving the reliability.

Second Embodiment

An electrical component according to the second embodiment will be described with reference to FIG. 6. In the first embodiment, the first layer is formed by two films having different coefficients of thermal expansion. In contrast to this, the second embodiment will exemplify a case in which the first layer is formed by three or more films having different coefficients of thermal expansion. Note that a description of the same parts in the first and second embodiments will be omitted, and different parts will be described.

[Structure]

FIG. 6 is a sectional view of an electrical component according to the second embodiment.

As shown in FIG. 6, the electrical component according to this embodiment includes a substrate 100 having a functional element 120, a first layer 109, a second layer 110, and a third layer 111.

The second embodiment differs from the first embodiment in that the first layer 109 is formed by a multilayer film including a first film 109a on the inner side (lower side), a second film 109b on the intermediate side which is formed on the first film 109a, and a third film 109d on the outer side (upper side) which is formed on the second film 109b.

More specifically, the first film 109a has a higher coefficient of thermal expansion than the second film 109b and the third film 109d. Although the second film 109b preferably has a higher coefficient of thermal expansion than the third film 109d, it may have a lower coefficient of thermal expansion. That is, in the first layer 109 having through holes 109c, the coefficient of thermal expansion on the inner side is highest.

In this case, the first film 109a, the second film 109b, and the third film 109d each are formed by, for example, an SiN film or SiO (SiO$_2$) film. In this case, controlling the film formation method for an SiN film or SiO (SiO$_2$) film will control the first film 109a to have the highest coefficient of thermal expansion. In this manner, it is possible to form a thin-film dome so as to make it expand outwardly by forming the first layer 109 using three layers having different coefficients of thermal expansion, with the first film 109a on the inner side having the highest coefficient of thermal expansion. That is, a large cavity 130 is formed.

In addition, the first layer 109 is not limited to a multilayer film including three films, and may be a multilayer film including four or more films. Even if the first layer 109 has a structure formed by a multilayer film including four or more films, it is possible to achieve the object by making the insulating film on the inner side have the highest coefficient of thermal expansion.

Furthermore, the first layer 109 is not limited to a multilayer film, and may be a gradation film whose coefficient of thermal expansion gradually decreases from the inner side (lower side) to the outer side (upper side). In this case, as a gradation film, an SiN film or SiO (SiO$_2$) film can be formed. In consideration of moisture resistance, it is more preferable to form an SiN film.

[Manufacturing Method]

As in the first embodiment, the process of manufacturing an electrical component in the second embodiment is executed up to the step in FIG. 3B. That is, a second sacrificial layer 108 made of an organic material such as polyimide is applied to cover the MEMS element 120 and a first sacrificial layer 105. The second sacrificial layer 108 is then patterned into a desired shape.

The first layer 109 having the plurality of through holes 109c is formed to cover the second sacrificial layer 108.

More specifically, first of all, the first film 109a serving as the inside film of a thin-film dome is formed to cover the second sacrificial layer 108. The first film 109a is formed to have a film thickness of, for example, several hundred nm to several µm. As a film formation method for the first film 109a, a CVD method is used.

The second film 109b serving as the intermediate film of the thin-film dome is formed on the first film 109a. The second film 109b is formed to have a film thickness of, for example, several hundred nm to several µm. The second film 109b is controlled to have a lower coefficient of thermal expansion than the first film 109a. As a film formation method for the second film 109b, a CVD method is used.

The third film 109d serving as the outside film of the thin-film dome is formed on the second film 109b. The third film 109d is formed to have a film thickness of, for example, several hundred nm to several μm. The third film 109d is controlled to have a lower coefficient of thermal expansion than the first film 109a. As a film formation method for the third film 109d, a CVD method is used.

A resist (not shown) is applied onto the third film 109d. Thereafter, the plurality of through holes 109c for the removal of the first and second sacrificial layers 105 and 108 are formed in the inside film (first film 109a), intermediate film (second film 109b), and outside film (third film 109d) of the thin-film dome by using a resist pattern (not shown), formed by a general lithography method, and an RIE method or wet etching method.

In this manner, the first layer 109 having the plurality of through holes 109c is formed by the first film 109a on the inner side, which has a high coefficient of thermal expansion, together with the second film 109b on the intermediate side and the third film 109d on the outer side, which have lower coefficients of thermal expansion than the first film 109a.

The subsequent steps are the same as those in the first embodiment, and hence a description of them will be omitted.

The second embodiment can obtain the same effects as those of the first embodiment.

In addition, in the second embodiment, the first layer 109 which has the through holes 109c and forms the cavity 130 is formed by a multilayer film including three or more layers. This makes the first layer 109 have higher durability and higher suppression of permeation of moisture in the atmosphere as compared with the first embodiment in which the first layer 109 is formed by two layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electrical component comprising:
   a substrate;
   an element formed on the substrate;
   a first layer which forms a cavity accommodating the element on the substrate and includes through holes; and
   a second layer which is formed on the first layer and seals the through holes,
   wherein the first layer includes a first film which is a lowermost layer of the first layer and faces the cavity and a second film which is formed on the first film and has a lower coefficient of thermal expansion than the first film, and the through holes are formed in both of the first film and the second film.

2. The component of claim 1, wherein the first film comprises a silicon nitride film, and the second film comprises a silicon oxide film.

3. The component of claim 1, wherein the first layer further includes a third film which is formed on the second film and has a lower coefficient of thermal expansion than the first film.

4. The component of claim 3, wherein the third layer has a lower coefficient of thermal expansion than the second layer.

5. The component of claim 1, wherein the first film and the second film comprise one of a silicon nitride film and a silicon oxide film.

6. The component of claim 5, wherein at least one of the first film and the second film comprises a silicon nitride film.

7. The component of claim 1, wherein the second layer has a lower coefficient of thermal expansion than the first layer.

8. The component of claim 1, wherein the second layer comprises a coating film made of an organic material.

9. The component of claim 1, wherein the first film and the second film each have a film thickness of several hundred nm to several μm.

10. The component of claim 1, wherein the through holes have a tapered shape which gradually decreases in diameter from an upper side to a lower side.

11. An electrical component comprising:
    a substrate;
    an element formed on the substrate;
    a first layer which forms a cavity accommodating the element on the substrate, includes through holes, has a coefficient of thermal expansion which decreases from a lowermost side to an uppermost side and faces the cavity; and
    a second layer which is formed on the first layer and seals the through holes.

12. The component of claim 11, wherein the first layer comprises one of a silicon nitride film and a silicon oxide film.

13. The component of claim 11, wherein the second layer has a lower coefficient of thermal expansion than the first layer.

14. The component of claim 11, wherein the second layer comprises a coating film made of an organic material.

15. The component of claim 11, wherein the first layer has a film thickness of several hundred nm to several μm.

16. The component of claim 11, wherein the through holes each have a tapered shape which gradually decreases in diameter from an upper side to a lower side.

17. An electrical component comprising:
    a substrate;
    an element formed on the substrate;
    a first layer which forms a cavity accommodating the element on the substrate and includes through holes; and
    a second layer which is formed on the first layer and seals the through holes,
    wherein the first layer includes a first film formed on a lower side, a second film which is formed on the first film and has a lower coefficient of thermal expansion than the first film, and a third film which is formed on the second film and has a lower coefficient of thermal expansion than the first film, and the through holes are formed in both of the first film and the second film.

* * * * *